United States Patent [19]
Neger et al.

[11] Patent Number: 5,874,807
[45] Date of Patent: Feb. 23, 1999

[54] LARGE AREA PLASMA PROCESSING SYSTEM (LAPPS)

[75] Inventors: Robert A. Neger, Crofton, Md.;
Richard F. Fensler, Annandale, Va.;
Martin Lampe, University Park;
Wallace Manheimer, Silver Spring, both of Md.

[73] Assignee: The United States of America as represented by the Secretary of the Navy, Washington, D.C.

[21] Appl. No.: 917,963

[22] Filed: Aug. 27, 1997

[51] Int. Cl.$^6$ .................................................... H05H 1/16
[52] U.S. Cl. ................................. 315/111.41; 315/111.71
[58] Field of Search ........................... 315/111.01–111.91

[56] References Cited

U.S. PATENT DOCUMENTS

| | | | |
|---|---|---|---|
| 5,627,435 | 5/1997 | Jansen et al. ................... | 315/111.41 X |
| 5,639,308 | 6/1997 | Yamazaki et al. .............. | 315/111.71 X |

*Primary Examiner*—David Mis
*Attorney, Agent, or Firm*—Thomas E McDonnell; Charles Stockstill

[57] ABSTRACT

The large area plasma processing system (LAPPS) is a system wherein an electron beam is used to produce a plasma. A large area uniform plasma is produced where length and width can be comparable (10's–100's of cm) and very much larger than the plasma thickness (~1 cm). The plasma distribution is created independent of the surface to be processed and the bias applied to the surface. The beam-produced plasma has a low intrinsic electron and excitation temperature plasma, allowing the process to be conducted with better control of free radical production. A material, such as a substrate, being processed may be placed in close proximity to plasma with controlled ion bombardment or without substantial bombardment by energetic ions. The system also offers a large available area for gas inflow and removal from the processing chamber and cathode chamber so as not to contaminate the material being processed or damage the cathode.

24 Claims, 2 Drawing Sheets

LARGE AREA PLASMA PROCESSING SYSTEM (LAPPS)

BACKGROUND OF THE INVENTION

1. Field of the Invention

This invention pertains generally to plasma processing and more particularly to a system capable of producing a spatially uniform sheet plasma over a large area.

2. Description of the Prior Art

There are many processes which utilize chemical and physical surface modifications activated by plasma. These methods include etching to remove surface material, utilizing plasma-enhanced chemical vapor deposition (PECVD) to deposit new material on a surface, modifying surfaces chemically by anodizing or nitriding, physically altering by ion implantation, or heating a surface by annealing via radiation or particle bombardment. In some cases, such as semiconductor etching and some types of PECVD, it is essential that the plasma be close to the surface so that energetic ions can be drawn from the plasma toward the surface thereby activating chemical reactions. In these cases the substrate can be biased using direct current (dc) or radio frequency (rf) electric fields on the substrate or backing plate to control the ion bombardment energy. In other cases such as diamond deposition and photoresist ashing, the surface is kept out of the plasma so that it is subject to chemical action of neutral radicals generated in the plasma, but is not bombarded by ions.

There are essentially four different general categories of non-thermal plasma sources, i.e., $T_e >> T_i$, $T_n$, presently in use or under industrial development for plasma processing. These are capacitively coupled, electron cyclotron resonance (ECR), helicon, and inductively coupled (IC) sources. The type of source used most widely for industrial processing is the capacitively coupled rf reactor. It consists of an electrode, upon which the surface to be processed can be mounted, connected to an rf source. The entire processing area is contained in a low pressure chamber complete with process gas feeds and a gas pumping system. The rf energy is capacitively coupled into a plasma which fills the entire chamber. In some forms of capacitively coupled devices, known as magnetically enhanced or magnetron sources, a magnetic field is used to partially confine and enhance the plasma in a volume adjacent to the electrode surface. Capacitively coupled rf reactors can produce a uniform plasma over hundreds of square centimeters area with ion density $\leq 10^{10}$ cm$^{-3}$. The same rf which produces the plasma in this type of reactor also generates a bias voltage between the plasma and the surface. This bias is the result of the different mobilities of the ions and electrons that form the plasma. This bias accelerates plasma ions toward the surface. The ion bombardment energy and the plasma density both increase with rf power injected into the reactor. Adjustments to the density can be made by changing the neutral gas density and rf power level but adjustments are limited due to the fact that the single rf source produces both the plasma and the bias voltage on the electrode.

For modern large area applications, higher ion density and lower ion bombardment energy than can be produced by capacitively coupled rf reactors are needed for some applications. Such higher density plasmas can be produced by ECR, helicon, and IC plasma sources. These plasma generators decouple the plasma production to some degree from the processing and allow one to independently control the ion bombardment energy using rf or dc bias on the surface to be processed. These sources suffer, however, from size and uniformity limitations. The sources can also be somewhat inefficient in that they heat the entire electron population to produce and maintain the desired plasma density near the surface to be processed. They also generate large volumes of plasma outside the processing region which shed energy to the surrounding surfaces.

In all of these devices the details of the plasma distribution are influenced by the energy source, the geometry, the neutral gas density, etc. The available plasma distribution depends on a large number of parameters, all of which may have to be tuned to produce a desired plasma condition. Under many circumstances compromises must be made between different parameters restricting the operating conditions available for processing.

Uniformity of feedstock gas and efficient removal of reaction products are also issues that limit the useful area in existing processing systems. Increasing processing area is extremely important to maximize throughput, and also to permit processing of large objects such as flat panel displays.

Another characteristic of existing processing systems is steady state operation. This is a natural mode of operation in typical cases where it takes minutes or longer to perform a particular processing operation. Recently, however, there have been indications that important features, such as the chemical makeup of the plasma or the deposition of charge on the substrate, can be controlled by pulsing the plasma density or bias voltage. Most of the existing sources cannot easily be pulsed on and off on the required fast (0.01–1.0 ms) time scale.

SUMMARY OF THE INVENTION

The object of this invention is to provide a means to form a large area high electron density uniform plasma whose length and width can be as large as 10's–100's of cm and very much larger than the plasma thickness (~1 cm).

Another object of this invention is to provide a system where the plasma distribution can be created independent of both the surface to be processed and the bias voltage (direct current or radio frequency) applied between the plasma and the surface.

Another object of this invention is to provide a system for producing a beam-produced plasma at a lower electron temperature $T_e$ than the prior art systems, and one in which $T_e$ can be controlled by the user.

Another object of this invention is to produce a device wherein the free radical formation can be controlled externally by adjusting $T_e$, the pulse duration, beam energy, etc.

Another object of this invention is a system where it is possible to place a substrate in close proximity to a plasma, and to control the bombardment of the substrate by energetic ions, or if desired, to prevent any substantial bombardment by energetic ions.

Another object is to produce a plasma for plasma processing applications in a plasma geometry which permits uniform gas feed and more uniform removal of reaction products.

Another objective is to provide a system which is more efficient at making a given plasma or free radical distribution than existing techniques.

These and other objectives are attained in the large area plasma processing system (LAPPS) wherein an electron beam is used to create a large area uniform sheet of plasma that is independent of the surface to be processed and the bias applied to the surface. The beam produced plasma also has advantages in plasma production efficiency, plasma electron temperature, ion flux control, and free radical production. The beam ionization technique is an efficient means to ionize a cold neutral gas, ionizing only the region exposed to the beam. The resultant plasma has a very low electron temperature ($T_e \leq 1$ eV). This intrinsically low electron temperature can, if desired, be increased in a controlled way by plasma heating, allowing one to control the ion flux through the ion sound speed ($\sim T_e^{1/2}$) independent of the bias voltage. Beam production of free radicals is also much more efficient than production via bulk plasma heating. Combined with electron temperature control one could also adjust the free radical species or density. In addition a material being processed may be placed in close proximity to the plasma without substantial bombardment by energetic ions if desired. The LAPPS geometry also has a large available area for pumping process products out of the processing chamber and cathode chamber so as not to contaminate the material being processed or damage the cathode. The temperature of the stage and the material to be processed can also be controlled by independently heating or cooling the stage.

DESCRIPTION OF THE PREFERRED EMBODIMENT

Figure 1:
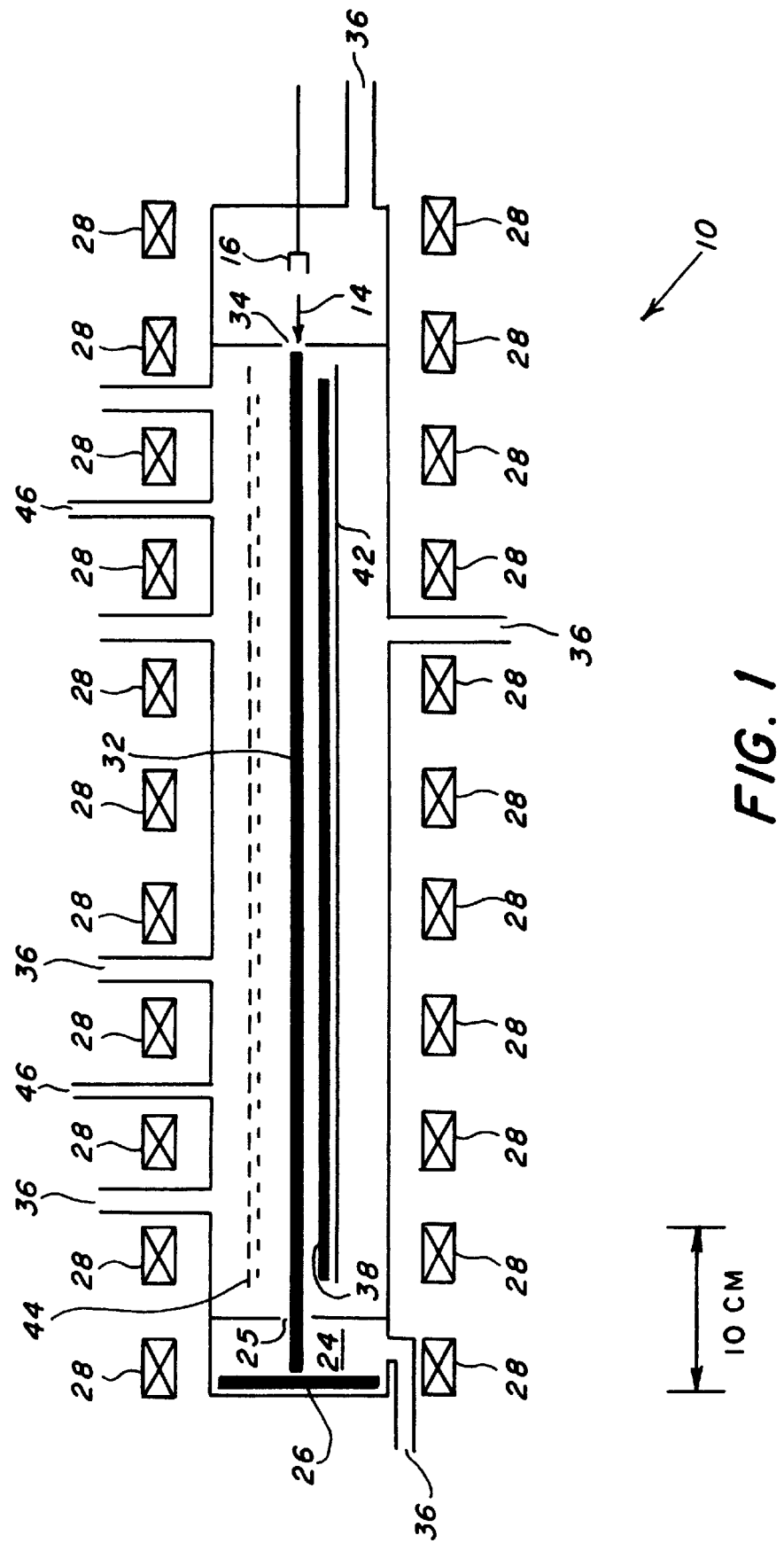
FIG. 1 shows a large area plasma processing system.

The large area plasma processing system (LAPPS) approach shown in FIG. 1 is a new way of forming a large area sheet plasma 32. The multiple adjustable parameters available to the system will enable a wide range of tuning capability, as well as optimization for diverse applications. It offers a means of making a large, uniform plasma distribution in a wide variety of gases. The control of the pulse length and rapid turn on and off times would provide the means to create a large range of conditions for different plasma processing operations.

The LAPPS 10 is designed to produce a beam 14 and sheet plasma 32 over an area between several hundred square centimeters to several square meters. The plasma 32 can be made spatially uniform over its lateral dimensions or can be given a lateral profile chosen for a particular application. The thickness of the plasma 32 sheet can be controlled by the cathode 16 size and magnetic field parameters. The plasma 32 thickness can be as small as 1 cm, although it may be desirable for some applications to produce a lower density, wider plasma distribution. Across its thickness, the plasma density will be peaked, with a maximum density as large as $5 \times 10^{12}$ cm$^{-3}$. Lower densities are possible by adjusting the beam 32 and gas density parameters.

The electron beam 14 generating the plasma 32 is produced by a linear cathode beam source driven by a beam voltage generator 16 located in a cathode chamber 18 adjacent to a processing chamber 22. The beam density necessary to produce this plasma density is ~50 mA/cm$^2$ or less. A linear cathode 16 is the preferred type of beam source, although other types of sources such as hot filaments, field emission sources, or radio frequency (rf) plasmas, may be useful for particular applications. The beam voltage generator 16 may be pulsed or continuous for different processing applications. The beam source 16 may be segmented to allow spatial control of the beam 14 current and energy in the lateral dimension. Feedback tuning of the beam 14, plasma 32, or process rate can be introduced through the cathode 16. The beam 14 energy is selected so that the beam 14 electrons can propagate to the end of the processing region 22 without losing their full energy. Typically this will require an electron energy of 1–5 keV, depending on the gas pressure and species in the processing chamber 22. The composition and pressure of the gas being supplied through openings 46 and the rate of gas feed, may be chosen to meet the needs of each type of process. The beam 14 exits the chamber 22 through a second rectangular aperture 25 isolating a beam dump chamber 24. After passing through the exit aperture 25, the beam 14 is absorbed by a beam dump 26. Debris from the beam dump 26, if any, is confined to the beam dump chamber 24. A reverse-biased system may be used to recover the beam 14 energy within the beam dump chamber 24.

A steady state magnetic field of approximately 100 to 200 Gauss is imposed along the direction of the beam 14 propagation by a series of rectangular or other shaped coils 28, with appropriate cooling (not shown) to permit continuous operation. It is easy to generate a very uniform field with coils 28 that are widely spaced, permitting the area between coils 28 to be used for gas inflow and pumping. This field confines the beam 14 electrons to a narrow sheet 32 as they propagate through the processing chamber 22. The field is controlled by adjusting the current in each coil 28 to focus or defocus the beam or change its location depending on the desired plasma conditions and processing geometry. The thickness of the sheet 32 is comparable to or larger than the transverse Larmor diameter of the beam 14 electrons in the magnetic field and is determined in part by the scattering of the beam 14 electrons by the gas. This serves as a condition for choosing the strength of the field. In typical applications where the sheet 32 thickness is 1 cm, the field strength is ~150 Gauss. Also, it may be desirable to have a continuous flow process, wherein the coils 28 may be configured so as to leave an opening on the sides of the chamber 22 to allow for the substrate or material 38 to be moved through the chamber 22 without having to cycle the vacuum system.

The beam 14 enters the processing chamber 22 via a narrow slit 34 which serves three purposes: first, the slit 34 isolates the processing plasma 32 electrically from the diode voltage. Second, the slit 34 clearly defines the edge of the beam 14, and therefore the edge of the plasma 32. Third, the slit 34 permits differential pumping through ports 36 to maintain a pressure difference between the source region in the outer chamber 18 and the processing chamber 22. The slit 34 may also be altered mechanically or the beam 14 location relative to the slit 34 changed using an auxiliary magnetic field in order to tune or alter the beam 14 (and therefore plasma 32) conditions in the processing chamber 22.

Figure 2:
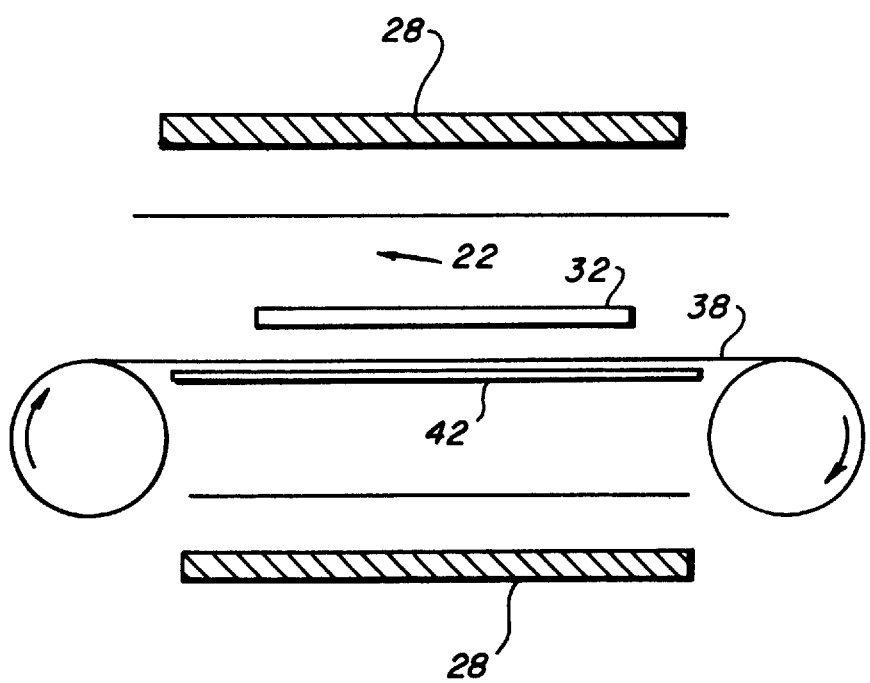
FIG. 2 shows a side view of a large area plasma processing system with a moving surface.

The substrate or sample 38 to be processed is mounted on a planar stage 42 which is oriented parallel (or in some cases at a slight angle) to the plasma sheet 32. The separation between the plasma 32 and the stage 42 is adjusted by moving the stage 42, and/or magnetically adjusting the location of the plasma 32. Typically, the stage 42 is shielded from direct impact by the electron beam 14 by the entrance slit 18. A second stage, or grid, 44 may be placed on the other side of the plasma 38 distribution to increase the available area for processing. This second grid 44 could provide a local ground for an rf bias or may be used as a second processing stage. The substrate 38 may be located adjacent to the edge of the plasma 38 or it may be separated from the edge by a distance chosen to be up to several cm away. The ion bombardment energy may be determined separately using an rf bias (not shown) or a dc voltage on the stage 42. The stage 42 could also represent a surface that could be scrolled perpendicular to the beam 32 direction, as shown in FIG. 2, for continuous feed surface treatment processing.

Experimentation has shown that a LAPPS plasma 32, again referring to FIG. 1, can be produced which is uniform in peak plasma 32 density to better than 10% over the present 0.6 meters in length and much better than 10% over its 0.6 meter width. The non-uniformity consists primarily of a systematic spreading of the plasma sheet, and decrease in the plasma density, over the length, due to scattering off the background gas. The plasma species densities, integrated over the thickness of the plasma sheet, is uniform to a much greater extent. Scaling up to several square meters is possible. Plasma uniformity may be improved changing the cathode 16 voltage or lateral current density profile or by slightly increasing the magnetic field strength as a function of distance from the source 16 to compensate for beam 14 spreading. In addition, uniformity of the process may be improved by compensation techniques, e.g., tilting the processing stage 42 with respect to the plane of the plasma 32; using multiple, independently controlled beam sources 16 to improve the uniformity of the plasma 32; moving the beam 14 laterally by changing the magnetic field; or rotating the stage 42 to average out the plasma 32. Processes that depend on integrated charge or free radical production rather than peak density may not require the use of these techniques due to the planar geometry.

The LAPPS 10 technique essentially decouples plasma production from the processing geometry. The plasma 32 is produced by the electron beam 14 which is set by the cathode 16 and magnetic field geometry. Thus the plasma 32 distribution can be moved independent of the surface to be processed and the bias (not shown) applied to the surface. This allows large area plasmas 32 to be formed, limited only by the ability to produce a uniform electron beam 14. The two-dimensional character of the plasma 32 also improves the plasma 32 uniformity, eliminating edge effects and electromagnetic mode dependent plasma density variations. It also allows maximum access to the plasma 32 and surfaces to be processed for real-time sensors and the ability to control the plasma 32 through the beam 14 and magnetic fields to maintain a desired level of uniformity. The planar geometry also allows more uniform gas feed and product or debris removal, resulting in more uniform processing. The planar geometry may even be extended to provide two-surface processing, above and below the plasma 32, if advantageous. Access to the processing stage for substrate 38 temperature control is also facilitated by the plasma 32 geometry.

The LAPPS 10 plasma also has significant advantages over existing processing plasmas. A beam-produced plasma has a much lower plasma electron temperature than either the capacitive or inductively coupled plasmas. As a result, many of the excited states of the atoms or molecules are characterized by a lower density and temperature. The low intrinsic plasma electron temperature also allows one to independently control the temperature if desired. An rf discharge current can be passed through the plasma distribution allowing one to heat the plasma electrons to a desired temperature. The low plasma electron temperature occurs because the beam energy ends up primarily in direct ionization and free radical formation, rather than in low-lying excitations and heating of the bulk plasma electrons (beam electrons both produce free radicals directly as well as via dissociative recombination of the background gas, making it an efficient process). Typical plasma electron energies will be less than 1 eV in a LAPPS 10 plasma 32. In many processes the production of free radicals is essential, either by themselves or as part of an ion impact process. By using pulsed rather than continuous beams and allowing the plasma 32 to relax between pulses, one can further control the radical formation. This means that the plasma chemistry can be varied by the choice of beam pulse length, pulse separation, and by controlling the plasma electron temperature.

The geometry and low temperature of the LAPPS 10 plasma 32 facilitates control over extraction of ions from the plasma. In most parameter regimes of interest, the cross-field mobility of the ions will exceed that of the plasma electrons. The lower temperature will decrease the ion flow leaving the plasma. Therefore the floating potential will be small or positive. It is possible then to immerse a substrate 42 in the plasma 32 without substantial bombardment by energetic ions. Ion bombardment characteristics are controlled by the bias (not shown) applied to the stage 42. It is possible to operate with highly directional ion bombardment at the chosen energy, e.g., for anisotropic etching. On the other hand, it is possible to operate with the substrate 42 just outside the plasma 32 so that a copious flux of neutral radicals can be delivered to the substrate 42, for applications such as diamond deposition, while allowing only minimal low energy ion flux on the substrate 42.

The LAPPS 10 source offers significant advantages and new capabilities in the physical size and geometry of the device as well as in the increased control of the plasma 32 produced. The geometric advantages of the LAPPS 10 primarily impact process productivity as well as allowing processing of larger area surfaces. The improved control of the plasma 32 provides better control of existing processing techniques as well as offering new capabilities for advanced techniques.

The LAPPS 10 production of the plasma is divorced from all other aspects of the plasma processing. In LAPPS 10, the geometry of the plasma is set with an external source. The LAPPS 10 utilizes an electron beam 14 injected into a neutral gas where ionization occurs, thus providing a means of forming a large area uniform plasma whose length and width are comparable (10's–100's of cm) and very much larger than the plasma thickness (~1 cm). The plasma distribution is created independent of the surface to be processed and the bias applied to the surface. The beam-produced plasma 32 has a lower electron temperature than the prior art systems, and the formation of radicals can be better controlled. The substrate 42 may be placed in close proximity to the plasma 32 without substantial bombardment by energetic ions.

Although the invention has been described in relation to an exemplary embodiment thereof, it will be understood by those skilled in the art that still other variations and modifications can be affected in these preferred embodiments without detracting from the scope and spirit of the invention as described in the claims.

What is claimed is:

1. A system for producing plasma comprised of:
   an electron beam source having a width much larger than its thickness;
   means for producing a low electron temperature plasma sheet of predetermined width, length, thickness, and location relative to a surface; and
   means for magnetizing the beam propagation and plasma so as to produce a geometrically well defined, spatially uniform thin plasma sheet.

2. A system, as in claim 1, further comprised of a means for predetermining and adjusting the plasma profile across the dimension transverse to the beam flow and along the beam propagation direction to suit a predetermined application.

3. A system, as in claim 2, wherein the means for predetermining and adjusting the plasma profile across the dimension transverse to the beam flow is through control of the beam spatial profile by controlling the cathode emission profile.

4. A system, as in claim 2, wherein the means for predetermining and adjusting the plasma profile across the dimension transverse to the beam flow is by the use of different beam limiters.

5. A system, as in claim 2, wherein the means for predetermining and adjusting the plasma profile across the dimension transverse to the beam flow is by controlling the magnetic field geometry.

6. A system, as in claim 2, wherein the means for predetermining and adjusting the plasma profile along the beam propagation direction is through control of the beam parameters and controlling the magnetic field to meet the requirements for a predetermined application.

7. A system, as in claim 2, wherein the means for predetermining and adjusting the plasma profile along the beam propagation direction is by controlling the magnetic field.

8. A system, as in claim 1, further comprised of a means for independently increasing initial plasma electron temperature to a predetermined level.

9. A system, as in claim 8, wherein the means for independently increasing initial plasma electron temperature to a predetermined level is by passing a direct current through the plasma.

10. A system, as in claim 8, wherein the means for independently increasing initial plasma electron temperature to a predetermined level is by passing radio frequency current through the plasma.

11. A system, as in claim 8, wherein the means for independently increasing initial plasma electron temperature to a predetermined level is by heating the plasma with an external microwave source.

12. A system, as in claim 1, further comprised of a means for pulsing the plasma sheet density.

13. A system, as in claim 12, wherein the means for pulsing the plasma sheet density is by pulsing the electron beam.

14. A system, as in claim 1, further comprised of a means to allow the plasma to decrease its density and other properties between pulses.

15. A system, as in claim 1, further comprised of a means for producing the sheet plasma an arbitrary distance from a surface.

16. A system, as in claim 1, further comprised of a means for biasing a surface at a predetermined voltage with respect to the plasma.

17. A system, as in claim 16, wherein the means for biasing the surface at a predetermined voltage with respect to the plasma is by using a constant voltage to control extraction of ions from the plasma.

18. A system, as in claim 16, wherein the means for biasing the surface at a predetermined voltage with respect to the plasma is by using a radio frequency voltage to control an extraction of ions from the plasma.

19. A system, as in claim 1, further comprised of a means for heating/cooling a surface.

20. A system, as in claim 1, further comprising a means for producing free radicals from the background gas.

21. A system, as in claim 1, wherein the means for producing free radicals from the background gas is by electron bombardment processes.

22. A system, as in claim 1, further comprised of a means for producing concentrations of free radicals in the sheet.

23. A system, as in claim 1, further comprised of a means for controlling free radical production.

24. A system, as in claim 23, wherein the means for controlling free radical production is by pulsing the beam.

* * * * *

UNITED STATES PATENT AND TRADEMARK OFFICE
CERTIFICATE OF CORRECTION

PATENT NO. : 5,874,807
DATED : February 23, 1999
INVENTOR(S) : Neger et al.

It is certified that error appears in the above-identified patent and that said Letters Patent is hereby corrected as shown below:

On the title page, item [19]:
    delete - Neger et al.
    insert - Meger et al.

item [75]   delete Robert A. Neger, Crofton, Md.;

insert Robert A. Meger, Crofton, Md.;

delete Richard F. Fensler, Annandale, Va.;

insert Richard F. Fernsler, Annandale, Va.;

Signed and Sealed this

Twentieth Day of July, 1999

Attest:

Q. TODD DICKINSON

*Attesting Officer*          *Acting Commissioner of Patents and Trademarks*